US011271057B2

(12) United States Patent
Peng

(10) Patent No.: US 11,271,057 B2
(45) Date of Patent: Mar. 8, 2022

(54) ARRAY SUBSTRATE, MANUFACTURING METHOD THEREOF, AND DISPLAY PANEL

(71) Applicant: Wuhan China Star Optoelectronics Semiconductor Display Technology Co., Ltd., Hubei (CN)

(72) Inventor: Hao Peng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 105 days.

(21) Appl. No.: 16/651,701

(22) PCT Filed: Feb. 12, 2020

(86) PCT No.: PCT/CN2020/074876

§ 371 (c)(1),
(2) Date: Mar. 27, 2020

(87) PCT Pub. No.: WO2021/114471

PCT Pub. Date: Jun. 17, 2021

(65) Prior Publication Data

US 2021/0183974 A1 Jun. 17, 2021

(51) Int. Cl.
*H01L 27/32* (2006.01)
*H01L 51/56* (2006.01)
(Continued)

(52) U.S. Cl.
CPC ...... *H01L 27/3258* (2013.01); *H01L 27/1288* (2013.01); *H01L 51/56* (2013.01);
(Continued)

(58) Field of Classification Search
CPC ............. H01L 27/1288; H01L 27/3276; H01L 27/3288; H01L 27/3297; H01L 51/0097; H01L 2251/5338
See application file for complete search history.

(56) References Cited

U.S. PATENT DOCUMENTS 11,043,547 B2 * 6/2021 Xu ...................... H01L 27/3276
2008/0203392 A1 * 8/2008 Kim .................... G02F 1/13452
257/59

(Continued)

FOREIGN PATENT DOCUMENTS

CN 106783917 A * 5/2017 ......... H01L 27/3258
CN 107546247 A * 1/2018 ............. H01L 27/32

(Continued)

OTHER PUBLICATIONS

Machine translation, Chen, Chinese Pat. Pub. No. CN 108550612A, translation date: Sep. 5, 2021, Espacenet, all pages. (Year: 2021).*

(Continued)

*Primary Examiner* — Victoria K. Hall
(74) *Attorney, Agent, or Firm* — Luedeka Neely Group, P.C.

(57) ABSTRACT

The disclosure relates to an array substrate, a manufacturing method thereof, and a display panel. In one aspect, an organic layer is disposed in a display area to release applied forces generated when the array substrate is frequently bent. In another aspect, without adding additional mask sheets, a portion of the organic material in a recess is removed by using a halftone mask, an organic material in other areas of the display area is completely removed, and an organic material of a photoresist layer in a bending area is retained. Therefore, a surface of the organic layer away from the substrate aligns with a surface of the interlayer insulating layer away from the substrate, so that there is no height difference when a top source/drain layer is disposed.

11 Claims, 3 Drawing Sheets

(51) Int. Cl.
*H01L 27/12* (2006.01)
*H01L 51/00* (2006.01)

(52) U.S. Cl.
CPC .... *H01L 51/0097* (2013.01); *H01L 2227/323* (2013.01); *H01L 2251/5338* (2013.01)

(56) References Cited

U.S. PATENT DOCUMENTS

| | | | | |
|---|---|---|---|---|
| 2009/0174834 | A1* | 7/2009 | Choi | H01L 27/1288 349/46 |
| 2009/0176325 | A1* | 7/2009 | Jeon | H01L 27/1288 438/34 |
| 2010/0163881 | A1* | 7/2010 | Kang | G02F 1/136259 257/59 |
| 2013/0087792 | A1* | 4/2013 | Chiu | H01L 27/1288 257/59 |
| 2015/0060857 | A1* | 3/2015 | Jung | H01L 27/1288 257/59 |
| 2018/0047802 | A1* | 2/2018 | Yoon | H01L 27/3262 |
| 2018/0226508 | A1* | 8/2018 | Chen | H01L 27/1214 |
| 2019/0072851 | A1* | 3/2019 | Tanigaki | G03F 7/40 |
| 2019/0140202 | A1* | 5/2019 | Jin | H01L 51/0097 |
| 2019/0148476 | A1* | 5/2019 | Park | H01L 51/0097 257/40 |
| 2019/0156708 | A1* | 5/2019 | Li | H01L 51/0011 |
| 2019/0334120 | A1* | 10/2019 | Seo | H01L 51/5246 |
| 2020/0043998 | A1* | 2/2020 | Choi | H01L 27/3246 |
| 2020/0067000 | A1* | 2/2020 | Li | H05K 1/0393 |
| 2020/0303479 | A1* | 9/2020 | Kim | H01L 27/3258 |
| 2021/0083208 | A1* | 3/2021 | Yu | H01L 27/3276 |
| 2021/0126073 | A1* | 4/2021 | Xu | H01L 27/3246 |
| 2021/0273026 | A1* | 9/2021 | Seo | H01L 51/0096 |
| 2021/0336164 | A1* | 10/2021 | Bu | H01L 51/5253 |

FOREIGN PATENT DOCUMENTS

| | | | | | |
|---|---|---|---|---|---|
| CN | 107546247 | A | * | 1/2018 | H01L 27/32 |
| CN | 108288637 | A | * | 7/2018 | H01L 27/3276 |
| CN | 108520895 | A | * | 9/2018 | H01L 27/32 |
| CN | 108520895 | A | * | 9/2018 | H01L 27/3244 |
| CN | 108550612 | A | * | 9/2018 | H01L 27/32 |
| CN | 108550612 | A | * | 9/2018 | H01L 27/3276 |
| CN | 109671748 | A | * | 4/2019 | H01L 27/32 |
| CN | 109671748 | A | * | 4/2019 | H01L 27/124 |
| CN | 109671761 | A | * | 4/2019 | H01L 27/32 |
| CN | 109671761 | A | * | 4/2019 | H01L 27/3244 |

OTHER PUBLICATIONS

Machine translation, Wang, Chinese Pat. Pub. No. CN 108520895A, translation date: Sep. 5, 2021, Espacenet, all pages. (Year: 2021).*

Machine translation, Bu, Chinese Pat. Pub. No. CN 109671761A, translation date: Sep. 5, 2021, Espacenet, all pages. (Year: 2021 ).*

Machine translation, Hu, Chinese Pat. Pub. No. CN 109671748A, translation date: Sep. 5, 2021, Espacenet, all pages. (Year: 2021 ).*

International Search Report, International Search Authority, International Application No. PCT/CN2020/074876, dated Apr. 29, 2020, WIPO, all pages. (Year: 2020).*

Machine translation, Yu, Chinese Pat. Pub. No. CN108288637A, translation date: Dec. 30, 2021, Espacenet, all pages. (Year: 2021 ).*

Machine translation, Hu, Chinese Pat. Pub. No. CN107546247A, translation date: Sep. 5, 2021, Espacenet, all pages. (Year: 2021).*

Machine translation, Hu, Chinese Pat. Pub. No. CN109671748A, translation date: Dec. 30, 2021, Espacenet, all pages. (Year: 2021 ).*

Machine translation, Wang, Chinese Pat. Pub. No. CN108520895A, translation date: Dec. 30, 2021, Espacenet, all pages. (Year: 2021).*

Machine translation, Bu, Chinese Pat. Pub. No. CN109671761A, translation date: Dec. 30, 2021, Espacenet, all pages. (Year: 2021 ).*

Machine translation, Chen, Chinese Pat. Pub. No. CN108550612A, translation date: Dec. 30, 2021, Espacenet, all pages. (Year: 2021).*

Machine translation, Li, Chinese Pat. Pub. No. CN106783917A, translation date: Dec. 30, 2021, Espacenet, all pages. (Year: 2021).*

* cited by examiner

ARRAY SUBSTRATE, MANUFACTURING METHOD THEREOF, AND DISPLAY PANEL

CROSS-REFERENCE TO RELATED APPLICATIONS

This application claims priority to China Patent Application No. 201911266283.3 filed on Dec. 11, 2019 with the National Intellectual Property Administration, titled "ARRAY SUBSTRATE, MANUFACTURING METHOD THEREOF, AND DISPLAY PANEL", which is incorporated by reference in the present application in its entirety.

FIELD

The present disclosure relates to the field of display technologies, and more particularly, relates to an array substrate, a manufacturing method thereof, and a display panel.

BACKGROUND

Organic light-emitting diode (OLED) devices are also called organic luminescent semiconductor devices. Regarding a working principle of OLEDs, holes from a cathode and electrons from an anode combine in a luminescent layer when electric power is supplied at appropriate voltages. Under an influence of Coulomb force, the holes and the electrons may recombine to form excitons (hole-electron pairs) which are in an excited state, and the excited state is unstable in normal environment. The excitons in the excited state transmit energy to luminescent materials, making the luminescent materials transition from a ground state to the excited state. Excitation energy generates photons, emits light energy, and creates light by radiation relaxation, and three primary colors, namely red, green, and blue, are generated according to compositions of the luminescent materials.

OLEDs have become one of the most important display technologies due to advantages such as low voltage requirement, high power saving efficiency, fast response times, light weight, thin body, simple structure, low cost, wide viewing angles, almost infinite contrast, and low power consumption.

Flexible display panels are frequently bent when being used, and cracks are easily generated due to force application. A force-relieving effect of organic layers is better than that of non-organic layers. Therefore, a recess is defined in a blank area of a wiring area, and an organic layer is filled in the recess to enhance the force-relieving effect. Because a recess area needs to be retained to be filled with the organic layer, when an organic layer in other areas is removed, a height difference is generated in the recess area, leading to breakage of a metal layer that is to cover the recess area in a subsequent process, and causing a large area of the organic layer to remain in a stacked structure. In a location where wires are connected, a depth of the recess significantly increases because of the organic layer. Therefore, metals of the wires are blocked and are unable to be completely deposited in the recess area, making the metals of the wires in the recess prone to damage. As a result, signals transmitted in a panel would be affected, leading to abnormal image display. Consequently, it is necessary to develop a novel display panel to solve the above problem.

SUMMARY

An objective of the present disclosure is to provide an array substrate, a manufacturing method thereof, and a display panel to solve following problem: in conventional display panels, a depth of a recess significantly increases in a location where wires are connected because of an organic layer. Therefore, metals of the wires are blocked and are unable to be completely deposited in a recess area, making the metals of the wires in the recess easy to be damaged. As a result, signals transmitted in a panel would be affected, leading to an abnormal image be displayed.

To solve the above problem, an embodiment of the present disclosure provides an array substrate, including a display area and a bending area. The array substrate includes a substrate, a barrier layer, an insulating layer, a plurality of conductive layers, and an interlayer insulating layer. The barrier layer is disposed on the substrate, the insulating layer is disposed on the barrier layer, the conductive layers are spaced from each other in the insulating layer, and the interlayer insulating layer is disposed on the conductive layers. In the display area, a depressed surface of the interlayer insulating layer away from the substrate reaches the barrier layer to form a recess, the recess is filled with an organic material to form an organic layer, and a surface of the organic layer away from the substrate aligns with a surface of the interlayer insulating layer away from the substrate.

Furthermore, the array substrate further includes a buffer layer, an active layer, a source/drain layer, and a planarization layer. The buffer layer is disposed between the barrier layer and the insulating layer, wherein the organic layer penetrates through the buffer layer. The active layer is disposed between the buffer layer and the insulating layer. A source/drain layer is disposed on the interlayer insulating layer, wherein the source/drain layer is connected to the active layer by a through hole. A planarization layer is disposed on the source/drain layer.

Furthermore, the insulating layer includes a first gate insulating layer and a second gate insulating layer, and each of the conductive layers includes a first gate layer and a second gate layer. The first gate insulating layer is disposed on the barrier layer, the first gate layer is disposed on the first gate insulating layer, the second gate insulating layer is disposed on the first gate layer, the second gate layer is disposed on the second gate insulating layer, and the interlayer insulating layer is disposed on the second gate layer.

Another embodiment of the present disclosure further provides a method of manufacturing an array substrate, including following steps: a barrier layer forming step, including defining a display area and a bending area of an array substrate to be manufactured, providing a substrate, and forming a barrier layer on the substrate; an insulating layer forming step, including forming an insulating layer on the barrier layer; a conductive layer forming step, including disposing a plurality of conductive layers spaced apart from each other in the insulating layer; an interlayer insulating layer forming step, including forming an interlayer insulating layer on the conductive layers, wherein a depressed surface of the interlayer insulating layer away from the substrate reaches the barrier layer to form a recess; and an organic layer forming step, including filling the recess with an organic material, wherein a surface of the organic layer away from the substrate aligns with a surface of the interlayer insulating layer away from the substrate.

Furthermore, the method further includes: a buffer layer forming step, including forming a buffer layer between the barrier layer and the insulating layer, wherein the organic layer penetrates through the buffer layer; an active layer forming step, including forming an active layer between the buffer layer and the insulating layer; a source/drain layer forming step, including forming a source/drain layer on the interlayer insulating layer, and connecting the source/drain layer to the active layer by a through hole; and a planarization layer forming step, including forming a planarization layer on the source/drain layer.

Furthermore, the insulating layer forming step includes a first gate insulating layer forming step and a second gate insulating layer forming step, and the conductive layer forming step includes a first gate layer forming step and a second gate layer forming step. The first gate insulating layer forming step includes: forming a first gate insulating layer on the barrier layer. The first gate layer forming step includes: forming a first gate layer on the first gate insulating layer. A second gate insulating layer forming step includes: forming a second gate insulating layer on the first gate layer. A second gate layer forming step includes: forming a second gate layer on the second gate insulating layer, wherein the interlayer insulating layer is formed on the second gate layer.

Furthermore, the organic layer forming step includes: coating the organic material on the interlayer insulating layer and in the recess, and removing a portion of the organic material in the recess by using a halftone mask.

Furthermore, the organic layer forming step further includes: removing the organic material on the insulating layer by exposure, wherein the surface of the organic layer away from the substrate aligns with the surface of the interlayer insulating layer away from the substrate after the organic layer forming step.

Furthermore, a light transmittance of the halftone mask ranges from 20% to 45%.

Another embodiment of the present disclosure further provides a display panel, including the array substrate of the present disclosure.

Regarding the beneficial effects: the present disclosure relates to an array substrate, a manufacturing method thereof, and a display panel. In one aspect, in the present disclosure, a depressed surface of the interlayer insulating layer away from the substrate reaches the barrier layer to form a recess in the display area, and the recess is filled with an organic material to form an organic layer. As a result, applied forces generated when the array substrate is frequently bent can be released. In another aspect, without adding additional mask sheets, a portion of the organic material in the recess is removed by using a halftone mask, the organic material in other areas of the display area is completely removed, and the organic material of a photoresist layer in a bending area is retained. Therefore, a surface of the organic layer away from the substrate aligns with a surface of the interlayer insulating layer away from the substrate, so that there is no height difference when a top source/drain layer is disposed. As a result, a problem that metals of the wires are blocked and are unable to be completely deposited in the recess area due to an overly deep recess, which causes the metals of the wires in the recess to be prone to damages, affects signals transmitted in a panel, and leads to an abnormal image display, can be prevented.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
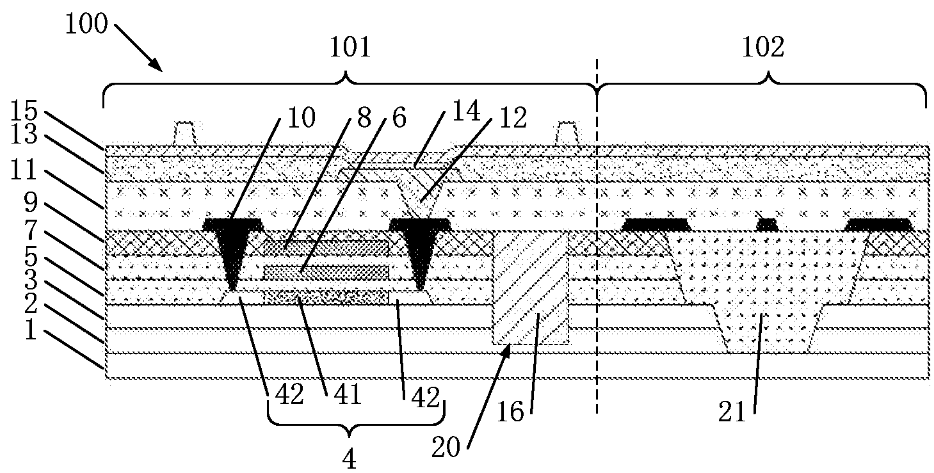
FIG. 1 is a schematic structural view showing a display panel of the present disclosure.

Preferred embodiments of the present disclosure are illustrated below with reference to accompanying drawings to prove that the present disclosure can be implemented. The embodiments are used to fully describe technical solutions of the present disclosure so that those skilled in the art may clearly and easily understand the technical solutions. The present disclosure may be realized by many different types of embodiments; therefore, the scope of protection of the present disclosure is not limited to the embodiments mentioned in the specification.

It should be understood that terms such as "upper", "lower", "front", "rear", "left", "right", "inside", "outside," "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

The identical or similar reference numerals constantly denote the identical or similar elements or elements having the identical or similar functions. In addition, for the sake of better understanding and description, the size and thickness of each component shown in the drawings are arbitrarily shown, but the present disclosure is not limited thereto.

It should be noted that a structure in which a first feature is "on" a second feature may include an embodiment in which the first feature directly contacts the second feature and may also include an embodiment in which an additional feature is formed between the first feature and the second feature. It should be noted that a structure in which a first feature is "mounted on" or "connected to" a second feature may include an embodiment in which the first feature directly mounted on or connected to the second feature and may also include an embodiment in which the first feature is mounted on or connected to the second feature by an additional feature.

First Embodiment

As shown in FIG. 1, a display panel 100 including a display area 101 and a bending area 102 is provided. The display panel 100 includes an array substrate. The array substrate includes a substrate 1, a barrier layer 2, a buffer layer 3, an active layer 4, a first gate insulating layer 5, a first gate layer 6, a second gate insulating layer 7, a second gate layer 8, an interlayer insulating layer 9, a source/drain layer 10, and a planarization layer 11. The display panel 100 further includes a plurality of anodes 12, a pixel defining layer 13, a luminescent layer 14, and a cathode 15.

The substrate 1 may include a first substrate, an interlayer, and a second substrate. The first substrate and the second substrate may be made of polyimide (PI), so that they have exceptional flexibility. The interlayer may be made of $SiO_2$, SiNx, or a stacked structure including $SiO_2$ and SiNx. The interlayer made of the above materials has exceptional moisture and oxygen barrier performance and good durability.

As shown in FIG. 1, the barrier layer 2 is disposed on the substrate 1 and can block moisture and oxygen.

As shown in FIG. 1, the buffer layer 3 is disposed on the barrier layer 2 and has buffer and protective functions.

As shown in FIG. 1, the active layer 4 is disposed on the buffer layer 3 in the display area 101. The active layer 4 includes a main body 41 and two lateral sections 42. Specifically, in the present embodiment, polysiliconization of the active layer 4 is realized by excimer laser polysiliconization technology. Then, the active layer 4 is patterned by using a photoresist mask to form the main body 41 and the two lateral sections 42. Finally, an ion doping process is performed on the active layer 4 and the two lateral sections 42 by using a photoresist mask to form a P-type semiconductor.

As shown in FIG. 1, the first gate insulating layer 5 is disposed on the active layer 4. The first gate layer 6 is disposed on the first gate insulating layer 5. The second gate insulating layer 7 is disposed on the first gate layer 6. The second gate layer 8 is disposed on the second gate insulating layer 7. The interlayer insulating layer 9 is disposed on the second gate layer 8. The source/drain layer 10 is disposed on the interlayer insulating layer 9. The source/drain layer 10 is connected to the active layer 4 by a through hole. Specifically, the source/drain layer 10 is connected to the two lateral sections 42 of the active layer 4 by the through hole. The planarization layer 11 is disposed on the source/drain layer 10.

As shown in FIG. 1, the anodes 12 are spaced from each other on the planarization layer 11. The pixel defining layer 13 is disposed on the planarization layer 11 between adjacent anodes 12. The luminescent layer 14 is disposed on the pixel defining layer 13. The anode 15 is disposed on the luminescent layer 14.

As shown in FIG. 1, in the display area 101, a depressed surface of the interlayer insulating layer 9 away from the substrate 1 reaches the barrier layer 2 to form a recess 20, and the recess 20 is filled with an organic material to form the organic layer 16. As a result, applied forces generated when the array substrate is frequently bent can be released by the organic layer 16 formed from the organic material. Furthermore, in the present embodiment, the organic layer 16 is only formed in the recess 20, and the organic material in other areas of the display area 101 is removed. Therefore, a problem that metals of the wires are blocked and are unable to be completely deposited in the recess area due to an overly deep recess, which causes the metals of the wires in the recess to be prone to damage, affects signals transmitted in a panel, and leads to an abnormal image display, can be prevented.

As shown in FIG. 1, a surface of the organic layer 16 away from the substrate 1 aligns with a surface of the interlayer insulating layer 9 away from the substrate 1. As a result, a height difference can be prevented from appearing between the organic layer 16 and the interlayer insulating layer 9 in the recess 20, thereby preventing images from being affected due to breakage of wires in a subsequent process.

Second Embodiment

Figure 2:
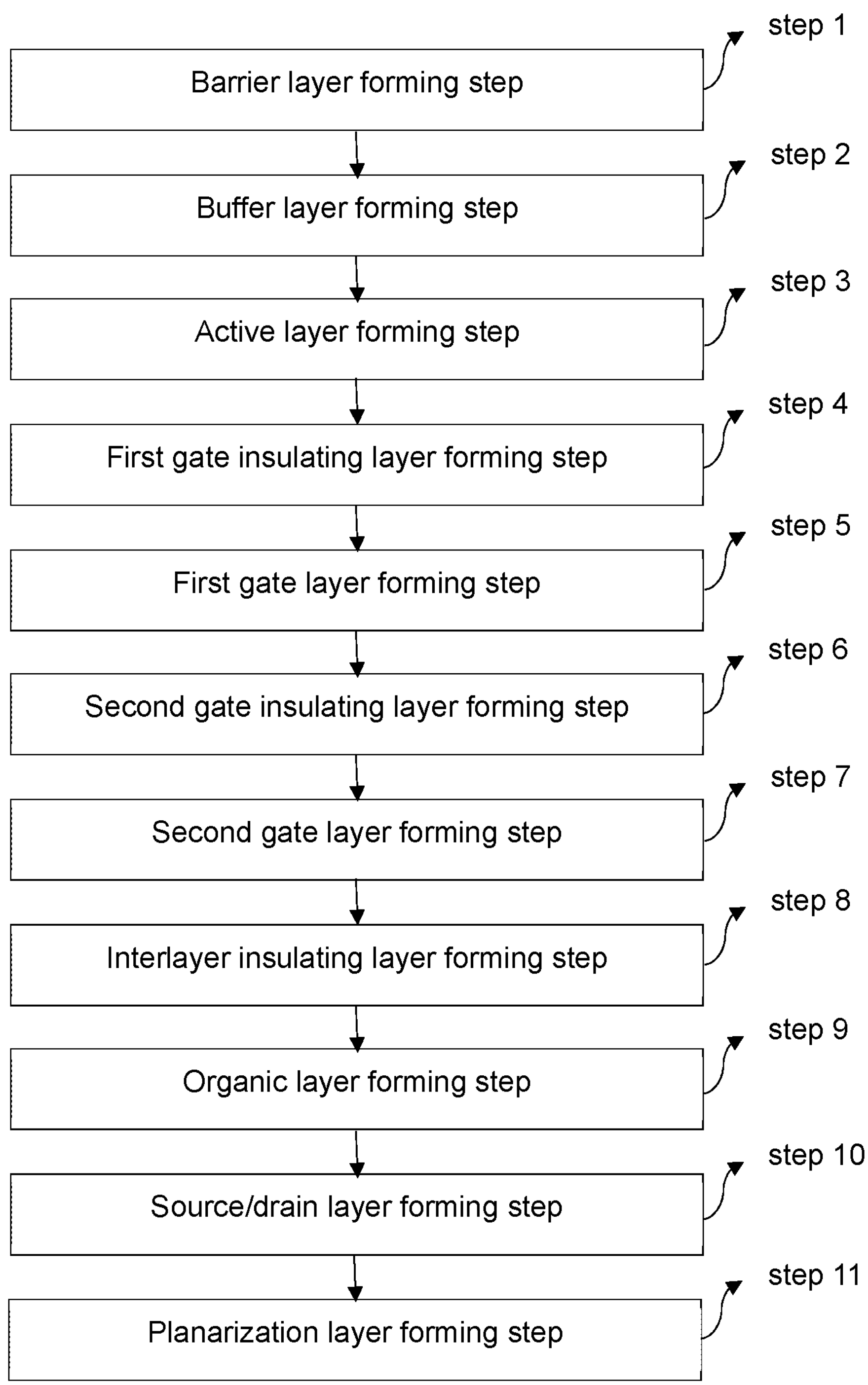
FIG. 2 is a flowchart showing steps of manufacturing an array substrate of the present disclosure.

As shown in FIG. 1 and FIG. 2, another embodiment of the present disclosure further provides a method of manufacturing an array substrate, including following steps: step 1: a barrier layer 2 forming step, including defining a display area 101 and a bending area 102 of an array substrate to be manufactured, providing a substrate 1, and forming a barrier layer 2 on the substrate 1; step 2: an buffer layer 3 forming step, including forming an buffer layer 3 on the barrier layer 2; step 3: an active layer 4 forming step, including forming an active layer 4 on the buffer layer 3; step 4: a first gate insulating layer 5 forming step, including forming a first gate insulating layer 5 on the active layer 4; step 5: a first gate layer 6 forming step, including forming a first gate layer 6 on the first gate insulating layer 5; step 6: a second gate insulating layer 7 forming step, including forming a second gate insulating layer 7 on the first gate layer 6; step 7: a second gate layer 8 forming step, including forming a second gate layer 8 on the second gate insulating layer 7; step 8: an interlayer insulating layer 9 forming step, including forming the interlayer insulating layer 9 on the second gate layer 8, wherein in the display area 101, a depressed surface of the interlayer insulating layer 9 in the display area 101 reaches the barrier layer 2 to form a recess 20; step 9: an organic layer 16 forming step, including filling the recess 20 with an organic material to form an organic layer 16, wherein a surface of the organic layer 16 away from the substrate 1 aligns with a surface of the interlayer insulating layer 9 away from the substrate 1; step 10: a source/drain layer 10 forming step, including forming a source/drain layer 10 on the interlayer insulating layer 9, and connecting the source/drain layer 10 to the active layer 4 by a through hole; and step 11: a planarization layer 11 forming step, including forming a planarization layer 11 on the source/drain layer 10.

Figure 3:
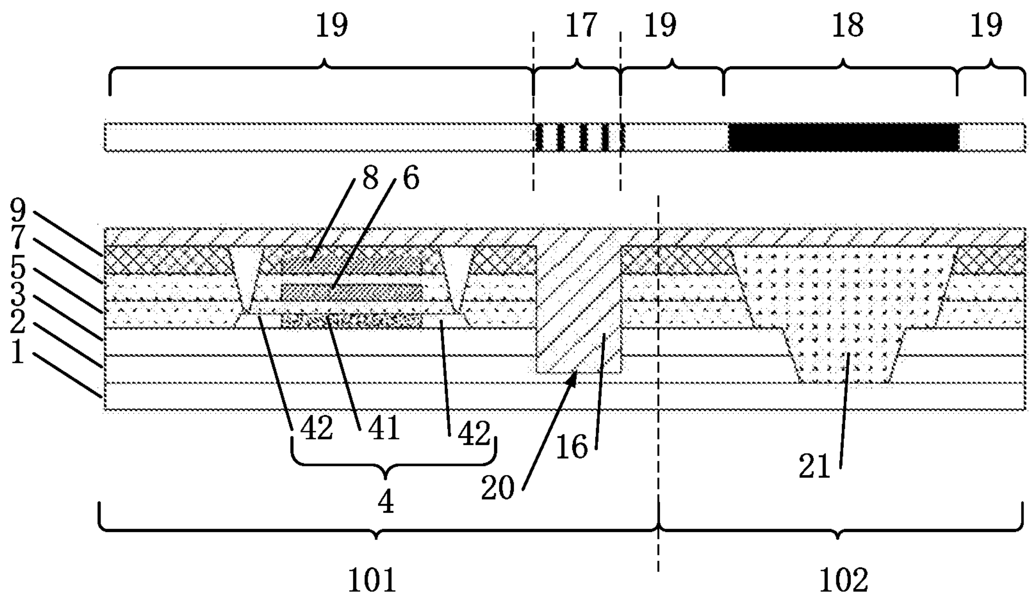
FIG. 3 is a schematic structural view showing the array substrate manufactured by the above steps.

As shown in FIG. 3, the organic layer 16 forming step includes: coating the organic material on the interlayer insulating layer 9 and in the recess, and exposing the organic layer 16 by using a mask sheet to remove the organic material. The mask sheet includes a first area 17, a second area 18, and a third area 19. The first area 17 corresponds to the recess 20, and the second area 18 and the third area 19 correspond to an organic photoresist layer 21 in the bending area 102. A portion of the organic material in the recess 20 in the first area 17 is removed by using a halftone mask to form the organic layer 16. The organic material on the interlayer insulating layer 9 in the third area 19 is completely removed by exposure. Therefore, an overly deep recess due to the organic material remaining outside the recess 20, which causes metals of the wires to be blocked and are unable to be completely deposited in the recess area and makes the metals of the wires in the recess prone to damage, can be prevented. As a result, signals transmitted in a panel would not be affected, and a problem of abnormal images can be prevented. Furthermore, the organic material in the recess 20 is retained to form the organic layer 16 that can release pressure when the array substrate is frequently bent. The organic material in the organic photoresist layer 21 in the second area 18 is retained by a normal mask process. A half mask process performed on the recess and a mask process performed for the organic photoresist layer 21 in the bending area 102 can be simultaneously performed. Therefore, without adding additional mask sheets, the organic photoresist layer 21 in the bending area 102 can be formed, the organic material in the recess 20 can be partially removed, and the organic material outside the recess 20 can be completely removed.

A light transmittance of the halftone mask ranges from 20% to 45%, so that the surface of the organic layer 16 away from the substrate 1 can align with the surface of the interlayer insulating layer 9 away from the substrate 1. As a result, there is no height difference appearing between the organic layer 16 and the interlayer insulating layer 9 in the recess, thereby preventing images from being affected due to breakage of wires in a subsequent process.

The organic material may be filled in the recess by vaporization or deposition.

The array substrate, the manufacturing method thereof, and the display panel provided by the present disclosure are described in detail above. It should be noted that embodiments illustrated in the present disclosure are used to help those skilled in the art understand the method and the spirit of the present disclosure, but are not used to limit the present disclosure. Descriptions of features or appearances in each embodiment are usually adapted to features or appearances in other embodiments. Although the present disclosure is illustrated by the embodiments, those skilled in the art are suggested to carry out many changes and modifications, and it is understood that such changes and modifications carried out without departing from the scope and the spirit of the disclosure are intended to be protected by the appended claims.

What is claimed is:

1. An array substrate, comprising a display area and a bending area;

wherein the array substrate comprises:

a substrate;

a barrier layer disposed on the substrate;

an insulating layer disposed on the barrier layer;

a plurality of conductive layers spaced apart from each other in the insulating layer; and an interlayer insulating layer disposed on the conductive layers;

wherein in the display area, a depressed surface of the interlayer insulating layer away from the substrate reaches the barrier layer to form a recess, and the recess is filled with an organic material to form an organic layer; and a surface of the organic layer away from the substrate aligns with a surface of the interlayer insulating layer away from the substrate.

2. The array substrate of claim 1, further comprising:

a buffer layer disposed between the barrier layer and the insulating layer, wherein the organic layer penetrates through the buffer layer;

an active layer disposed between the buffer layer and the insulating layer;

a source/drain layer disposed on the interlayer insulating layer, wherein the source/drain layer is connected to the active layer by a through hole; and a planarization layer disposed on the source/drain layer.

3. The array substrate of claim 1, wherein the insulating layer comprises a first gate insulating layer and a second gate insulating layer, and each of the conductive layers comprises a first gate layer and a second gate layer; and the first gate insulating layer is disposed on the barrier layer, the first gate layer is disposed on the first gate insulating layer, the second gate insulating layer is disposed on the first gate layer, the second gate layer is disposed on the second gate insulating layer, and the interlayer insulating layer is disposed on the second gate layer.

4. A display panel, comprising the array substrate of claim 1.

5. The display panel of claim 4, further comprising:

a buffer layer disposed between the barrier layer and the insulating layer, wherein the organic layer penetrates through the buffer layer;

an active layer disposed between the buffer layer and the insulating layer;

a source/drain layer disposed on the interlayer insulating layer, wherein the source/drain layer is connected to the active layer by a through hole; and a planarization layer disposed on the source/drain layer.

6. The display panel of claim 4, wherein the insulating layer comprises a first gate insulating layer and a second gate insulating layer, and each of the conductive layers comprises a first gate layer and a second gate layer; and the first gate insulating layer is disposed on the barrier layer, the first gate layer is disposed on the first gate insulating layer, the second gate insulating layer is disposed on the first gate layer, the second gate layer is disposed on the second gate insulating layer, and the interlayer insulating layer is disposed on the second gate layer.

7. A method of manufacturing an array substrate, comprising following steps:

a barrier layer forming step, comprising defining a display area and a bending area of an array substrate to be manufactured, providing a substrate, and forming a barrier layer on the substrate;

an insulating layer forming step, comprising forming an insulating layer on the barrier layer;

a conductive layer forming step, comprising disposing a plurality of conductive layers spaced apart from each other in the insulating layer;

an interlayer insulating layer forming step, comprising forming an interlayer insulating layer on the conductive layers, wherein a depressed surface of the interlayer insulating layer away from the substrate reaches the barrier layer to form a recess; and an organic layer forming step, coating the organic material on the interlayer insulating layer and in the recess, and removing a portion of the organic material in the recess by using a halftone mask;

wherein a surface of the organic layer away from the substrate aligns with a surface of the interlayer insulating layer away from the substrate.

8. The method of claim 7, further comprising following steps:

a buffer layer forming step, comprising forming a buffer layer between the barrier layer and the insulating layer, wherein the organic layer penetrates through the buffer layer;

an active layer forming step, comprising forming an active layer between the buffer layer and the insulating layer;

a source/drain layer forming step, comprising forming a source/drain layer on the interlayer insulating layer, and connecting the source/drain layer to the active layer by a through hole; and a planarization layer forming step, comprising forming a planarization layer on the source/drain layer.

9. The method of claim 7, wherein the insulating layer forming step comprises a first gate insulating layer forming step and a second gate insulating layer forming step, and the conductive layer forming step comprises a first gate layer forming step and a second gate layer forming step;

the first gate insulating layer forming step comprises forming a first gate insulating layer on the barrier layer;

the first gate layer forming step comprises forming a first gate layer on the first gate insulating layer;

the second gate insulating layer forming step comprises forming a second gate insulating layer on the first gate layer; and the second gate layer forming step comprises forming a second gate layer on the second gate insulating layer;

wherein the interlayer insulating layer is formed on the second gate layer.

10. The method of claim 7, wherein the organic layer forming step further comprises removing the organic material on the insulating layer by exposure, wherein the surface of the organic layer away from the substrate aligns with the surface of the interlayer insulating layer away from the substrate after the organic layer forming step.

11. The method of claim 7, wherein a light transmittance of the halftone mask ranges from 20% to 45%.

* * * * *